United States Patent [19]

Higgs

[11] Patent Number: 4,761,569

[45] Date of Patent: Aug. 2, 1988

[54] DUAL TRIGGER HALL EFFECT I.C. SWITCH

[75] Inventor: Jacob K. Higgs, Salisbury, N.H.

[73] Assignee: Sprague Electric Company, North Adams, Mass.

[21] Appl. No.: 17,955

[22] Filed: Feb. 24, 1987

[51] Int. Cl.[4] .................. H03K 17/90; H03K 3/29
[52] U.S. Cl. .................................. 307/309; 307/290; 324/251
[58] Field of Search ............... 307/309, 290; 324/251; 329/200; 332/384; 323/368, 194

[56] References Cited

U.S. PATENT DOCUMENTS

| | | | |
|---|---|---|---|
| 3,164,727 | 1/1965 | Heyda | 307/290 |
| 3,324,398 | 6/1967 | Moore | 307/290 |
| 4,200,814 | 5/1980 | Tanaka et al. | 307/309 |
| 4,218,626 | 8/1980 | Fukada et al. | 307/309 |
| 4,283,643 | 8/1981 | Levin | 323/368 |
| 4,296,410 | 10/1981 | Higgs et al. | 307/309 |
| 4,443,716 | 4/1984 | Avery | 307/309 |

Primary Examiner—Stanley D. Miller
Assistant Examiner—B. P. Davis

[57] ABSTRACT

An integrated circuit switch including a Hall element, a Hall-voltage amplifier having an output to which the inputs of two Schmitt trigger circuits are connected may be mounted between stator windings in a brushless D.C. motor as a rotor position detector and motor commutator circuit. The outputs of the respective Schmitt trigger circuit may be connected to excite a pair of the stator windings. The two binary exciting signals are mutually complimentary except for having non-simultaneous changes from one binary state to the other. Integrated circuits of this invention eliminate acoustic noise that is caused by such overlapping stator currents that were unwittingly present in commutation circuits of the prior art.

2 Claims, 1 Drawing Sheet

Fig. 1.
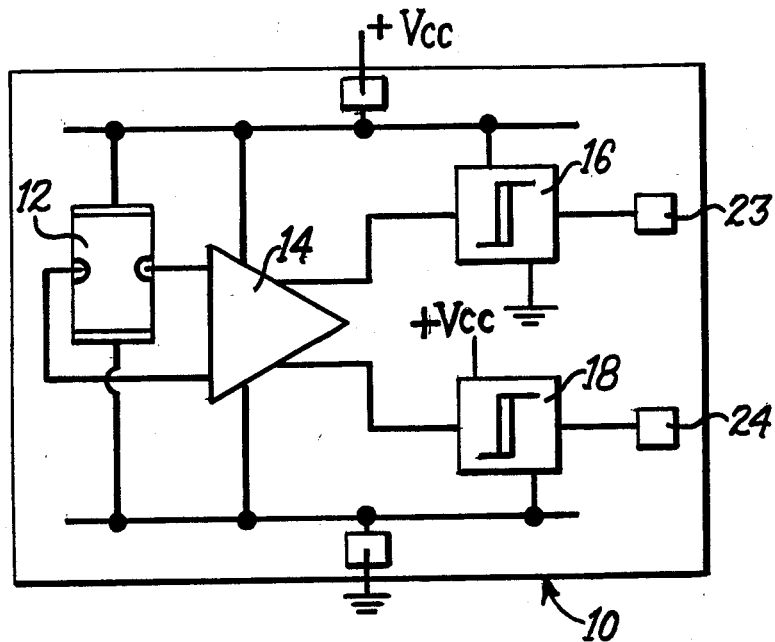
Fig. 2.
Fig. 3.
Fig. 4.
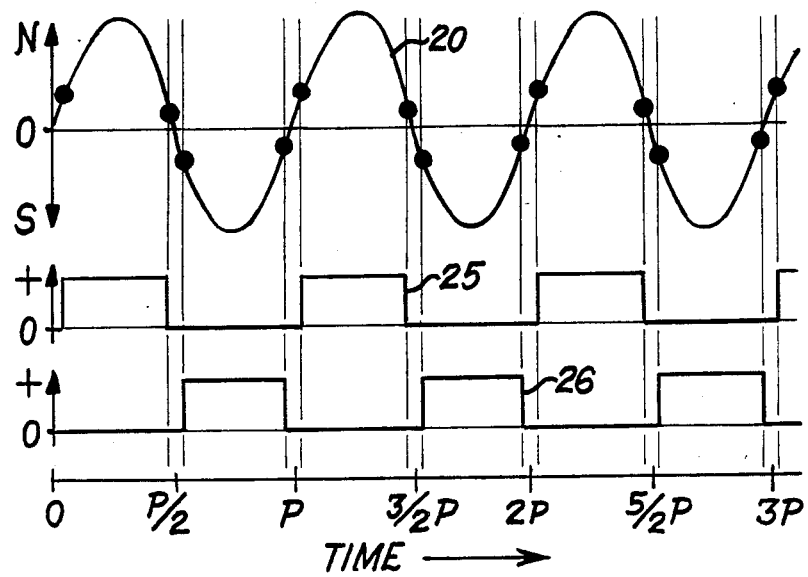

DUAL TRIGGER HALL EFFECT I.C. SWITCH

BACKGROUND OF THE INVENTION

This invention relates to an integrated circuit Hall switch and more particularly to such an integrated circuit including two Schmitt trigger circuits responding to the output from a single Hall element therein to provide two trains of non-overlapping current pulses to two inductive loads, e.g. stator windings on a D.C. brushless motor.

In an integrated circuit described in the patent to Avery, U.S. Pat. No. 4,443,716, issued Apr. 17, 1984 and assigned to the same assignee as is the present invention, there is described an integrated circuit Hall-switch including a Hall element, a Hall-voltage amplifier followed by a Schmitt trigger circuit. For use as a magnetic field sensor, this integrated circuit has an output that changes from one level to another level when the ambient magnetic field exceeds a predetermined magnitude. This I.C. (integrated circuit) Hall-switch has operate and release points that are adjusted as desired by mounting a magnet to the IC and partially demagnetizing the magnet.

In my patent application Ser. No. 912,709 filed Sept. 29, 1986, I have described another method for adjusting the hysteresis characteristic of such an I.C. Hall switch. Briefly, this entails providing in the I.C. a string of series connected resistors across one of the differential inputs of the Schmitt circuit. All but one of these resistors are shorted by a metal film conductor. By selectively opening certain of these shorting conductors, the string resistance is adjusted to adjust in turn the operate (and release) points of the I.C. Hall switch.

Integrated circuits or I.C. Hall switches of such kinds find use as rotor position sensors in D.C. brushless motors that have magnetized rotors. The stator windings are excited by a solid state commutating circuit. Typically, such a motor has a two-magnetic-pole rotor, four stator windings. Two Hall switches may be mounted, between stator windings, 90° apart. Responding to the rotor field, the output from each Hall sensor provides pulses of current to one pair of stator windings such that when one is on the other is off. This is typically accomplished by circuitry in the Hall sensor that provides a differential (two complimentary) output, each phase of which, respectively, is for exciting one of a pair of stator windings.

A fuller description of D.C. brushless motors construction including the use therein of Hall devices as rotor position sensors is provided in the book *Direct Current Machines* by M. Say and E. Taylor, second edition, Pitman and Son, Ltd; London 1985: pp. 79–80, 121–124 and 296–300.

It has been observed, however, that electronically-commutated brushless D.C. motors tend to generate objectionable acoustic noise.

It is an object of this invention to provide a commutation circuit that reduces such acoustic noise.

It is a further object of this invention to provide a commutation circuit including a pair of integrated Hall-switches that are capable of driving a pair of stator windings in a D.C. brushless motor by generating a pair of binary output signals that deviate from a mutually complimentary relationship only on account of having nonsimultaneous changes from one binary state to the other in response to changes in the ambient magnetic field strength.

SUMMARY OF THE INVENTION

Broadly, this invention is to an integrated circuit Hall switch comprising a Hall element and two Schmitt trigger circuits having inputs respectively connected to the output of the Hall element.

In one particular aspect of the invention, an integrated circuit Hall switch comprises a Hall element and two Schmitt trigger circuit means, each circuit means having an input connected to the output of the Hall element. One of the circuit means is for providing at an output thereof a binary signal that changes from one state to another state when the strength of a magnetic field in one polarization ambient to the Hall element exceeds a first value, and that changes again to the one state when the strength of said one polarization field drops below a second predetermined value that is less than the first value.

The other circuit means is for providing at an output thereof a binary signal that changes from one state to another state when the strength of a magnetic field in the opposite polarization ambient to the Hall element exceeds a third value, and that changes again to the one state when the strength of a magnetic field of the opposite polarization ambient to the Hall element drops below a fourth value that is less than the third value.

For use as a position sensor and commutation circuit in a brushless D.C. motor, circuits of this invention reduce the afore-mentioned objectionable acoustic noise providing a simple, low cost integrated solution that is effective for a wide range of motor speeds and brushless D.C. motor designs.

BRIEF DESCRIPTION OF THE DRAWINGS

FIG. 1 shows a diagram of an integrated ciruit of this invention.

FIG. 2 shows a graph of strength of a magnetic field pattern as a function of time, which field is ambient to the Hall element in the integrated circuit of FIG. 1.

FIGS. 3 and 4 show graphs, respectively, of output signal levels at the two outputs of the integrated circuit of FIG. 1 mounted in a D.C. brushless motor in response to the ambient field shown in FIG. 2. Time is taken along the abcissas to the same scale in FIGS. 2, 3 and 4.

DESCRIPTION OF THE PREFERRED EMBODIMENTS

Figure 5:
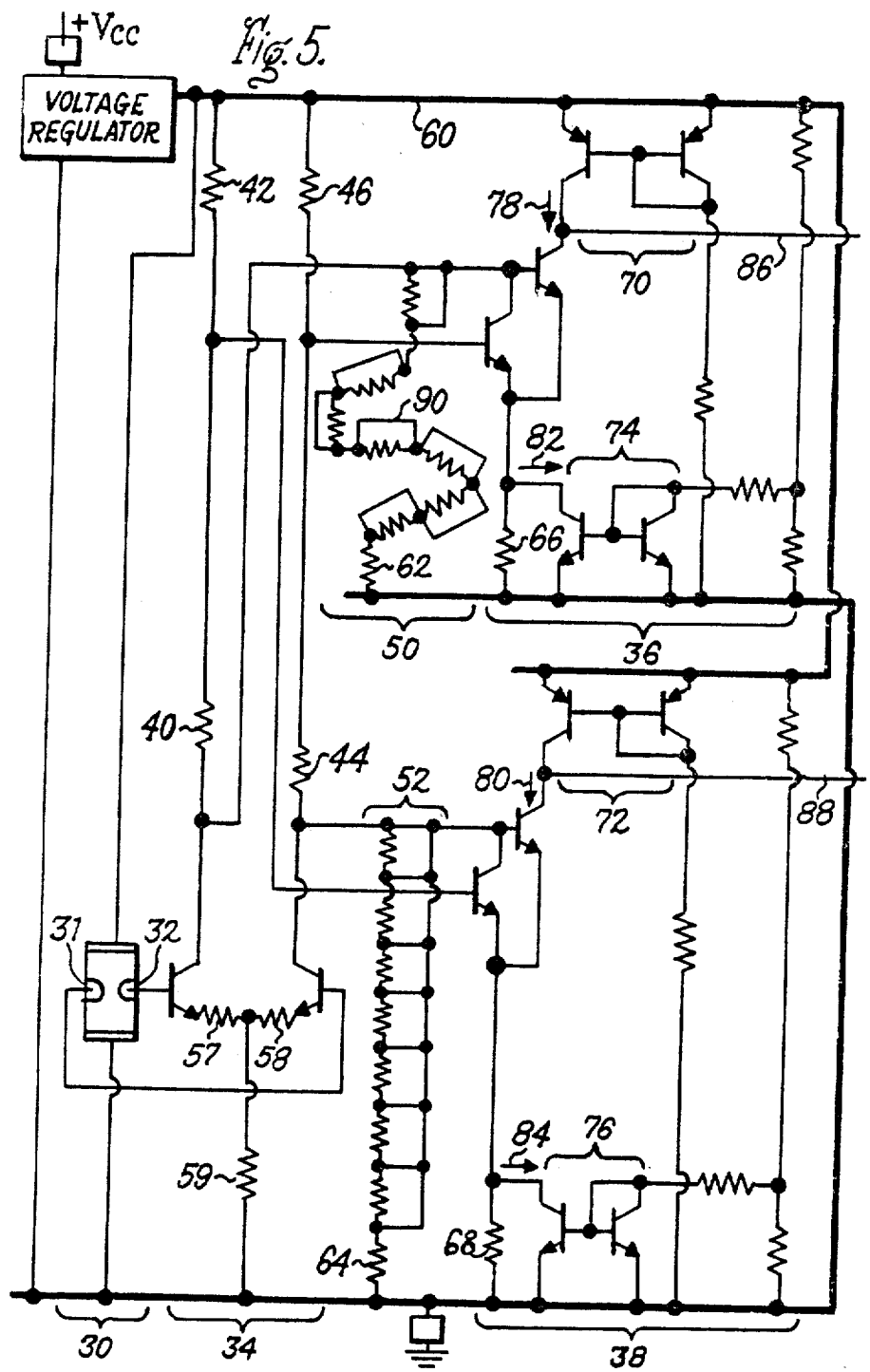
FIG. 5 shows a circuit diagram of another integrated circuit of this invention.

In FIG. 1 an integrated circuit 10 includes a Hall element 12, a differential amplifier 14 for amplifying the voltage from the output of the Hall element 12, and two Schmitt trigger circuits 16 and 18, each having a singleended input. The inputs of the Schmitt trigger circuits 16 and 18 are respectively connected to one and the other phases of the differential output of amplifier 14.

In operation, this integrated circuit may be mounted adjacent the periphery of the magnetized rotor of a DC brushless motor (not shown). The rotating rotor produces a changing magnetic field normal to the Hall element 12, which field may have an undulating strength such as that shown by the curve 20 in FIG. 2. The two polarites of that field are indicated in the ordinate as N (north) and S (south).

The two Schmitt trigger circuits 16 and 18 are assumed to have about identical operating characteristics, i.e. having the same operate and release points. Thus, for north magnetic fields, only Schmitt trigger circuit 16 is actuated producing an output signal at integrated circuit terminals 23 as indicated by curve 25 in FIG. 3. On the other hand, for south magnetic fields, only Schmitt trigger circuit 18 is activated producing an output signal at integrated circuit terminal 24 as indicated by curve 26 in FIG. 4.

The output signals 25 and 26 are intended to drive the stator field windings in the DC brushless motor, and the Schmitt trigger circuits 16 and 18 may each include appropriate power amplifiers for this purpose. It is especially notable that the on-state portion of motor winding signal 25 at terminal 23 is never abutting with but is spaced in time from the on-state portion of winding signal 26 at terminal 24.

Referring now to FIG. 5, a Hall element 30 with output pads 31 and 32 is connected to the input of a differential amplifier 34. The differential input of a first Schmitt trigger circuit 36 is connected to the two phases of the differential output of the amplifier 34. Likewise, the differential input of the second Schmitt trigger circuit 38 is connected to the two phases of the differential output of the amplifier 34, but in such a manner that the second circuit 38 responds to one polarity of the amplifier output signal whereas the first circuit 36 responds only to the other polarity.

Furthermore, the output load across which each phase of the amplifier output signal voltages appear consists of two resistors in series, namely resistors 40 and 42 for one output phase and resistors 44 and 46 for the other phase. Differential connection of the input of the first Schmitt trigger circuit 36 is from across all of one load, e.g. resistors 40 and 42, to only part of the other, e.g. between resistors 44 and 46. This has the effect of shifting or skewing the operate and release points of the first Schmitt trigger circuit to a higher magnitude region in one polarity (e.g. north).

Similarly, the second Schmitt trigger circuit has its input differentially connected to those same amplifier loads except in the dual or opposite sense so as to shift the operate and release field points to a greater field magnitude region in the opposite polarity (e.g. south).

The term "operate point" means the sensed magnetic field strength that is just large enough to cause the device to switch from a first state to a second state, and the term "release point" means the sensed ambient magnetic field stength at which the device switches back from the second to the first state. For a Hall switch such as in FIG. 5, wherein the hysteresis loop, associated with each Schmitt trigger circuit, is all for one polarity of the ambient magnetic field being sensed, release point is of the same polarity and is lower than operate point. Hysteresis is defined as the difference between operate and release points. For Hall switches having a symmetrical hysteresis loop, the operate and release points have different polarities.

An integrated circuit having a Hall element and a single Schmitt trigger circuit is described in the above-noted patent application Ser. No. 912,709. Also included there is a description of series-connected and conductor-shunted resistors such as the resistor strings 50 and 52 shown connected across one input of each of the Schmitt trigger circuits 36 and 38, respectively. For example, string 50 may have one or more of the conductive shunts removed by laser vaporization of the metal to adjust the operate point of Schmitt circuit 36 without changing the hysteresis or changing the temperature characteristics of either.

The regulated voltage at bus 60 is 3.3 volts.

Preferred resistor values for the circuit in FIG. 5 are given in the Table.

TABLE

| Resistor | Value (Ohms) |
|---|---|
| 40, 44 | 20 |
| 42, 46 | 1300 |
| 57, 58 | 60 |
| 59 | 600 |
| 62, 64 | 28K |
| 66, 68 | 26K |

The current sources 70 and 72 respectively provide currents to 78 and 80 of about 30 microamps each while the current sources 74 and 76 sink currents from 82 and 84 of about 0.5 microamps each.

Conductor 86 (88) may be taken as the output of Schmitt trigger circuit 36 (38). However, when the Schmitt trigger circuits 36 and 38 are each to excite a stator winding of a D.C. brushless motor, then an amplifier (not shown) is preferably connected between each of the conductors 86 and 88 and the two stator windings, respectively. Such amplifiers may be considered to be a part of the respective Schmitt trigger circuits 36 and 38.

When due to the presence of an ambient magnetic field of one polarity the Hall sense terminal goes positive enough with respect to Hall sense terminal 31, the voltage at conductor 86 changes from a voltage near the regulated D.C. voltage on bus 60 to a lower voltage state. That operate point measured in terms of the magnetic field amplitude just necessary to so switch the Schmitt trigger circuit 36 is preferably about the same as that of the Schmitt trigger circuit 38 except being for magnetic fields of the opposite polarity. The resistor shunts, e.g. 90, in the series branch 50 may be opened as necessary to adjust downwardly the operate point of Schmitt trigger circuit 36 to a desired target value. The total resistance of branch circuit 52 may likewise be adjusted to effect a desired downward adjustment of the Schmitt circuit 38 operate point, e.g. to the same target value.

What is claimed is:

1. An integrated-circuit comprising a Hall element and two Schmitt trigger circuit means connected to the output of said Hall element, the operate and release points of said two Schmitt trigger circuit means respectively, being at magnetic fields of opposite polarities, so that the output signals of said two Schmitt trigger circuits are mutually complementary but have non-simultaneous changes from one state to the other.

2. An integrated-circuit Hall switch comprising:
   a Hall element;
   a first Schmitt trigger circuit means connected to the output of said Hall element, for providing a binary signal that changes from one binary level to another level when the strength of a magnetic field in one polarization ambient to said Hall element exceeds a first predetermined value, and that changes back to said one level when the strength of said one polarization field drops below a second predetermined value that is less than said first value; and
   a second Schmitt trigger circuit means connected to the output of said Hall element for providing a binary signal that changes from said one level to said another level when the strength of a magnetic field of the opposite polarization ambient to said Hall element exceeds a third predetermined value, and that changes back to said one level when the strength of said opposite polarization field drops below a fourth predetermined value that is less than said third value.

* * * * *

UNITED STATES PATENT AND TRADEMARK OFFICE
CERTIFICATE OF CORRECTION

PATENT NO.  : 4,761,569

DATED       : August 2, 1988

INVENTOR(S) : Jacob K. Higgs

It is certified that error appears in the above-identified patent and that said Letters Patent is hereby corrected as shown below:

Insert the attached sheet of original drawings containing Figure 5.

Signed and Sealed this

Twenty-ninth Day of November, 1988

*Attest:*

DONALD J. QUIGG

*Attesting Officer*  *Commissioner of Patents and Trademarks*